(12) United States Patent
Najda

(10) Patent No.: US 6,631,150 B1
(45) Date of Patent: Oct. 7, 2003

(54) SEMICONDUCTOR DEVICE

(75) Inventor: Stephen Peter Najda, Oxford (GB)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/610,019

(22) Filed: Jul. 5, 2000

(30) Foreign Application Priority Data

Jul. 6, 1999 (GB) .......................................... 9915672

(51) Int. Cl.⁷ ................................................ H01S 5/00
(52) U.S. Cl. ........................................ 372/45; 372/46
(58) Field of Search .......................... 372/43, 45, 46, 372/96

(56) References Cited

U.S. PATENT DOCUMENTS

| | | | |
|---|---|---|---|
| 4,835,116 A | 5/1989 | Lee et al. | 437/111 |
| 5,048,036 A | * 9/1991 | Scifres et al. | 372/45 |
| 5,300,794 A | 4/1994 | Melman et al. | 257/190 |
| 5,345,463 A | 9/1994 | Mannoh et al. | 372/45 |
| 5,508,554 A | 4/1996 | Takatani et al. | 257/617 |
| 5,665,977 A | 9/1997 | Ishibashi et al. | 257/17 |
| 5,838,705 A | 11/1998 | Shieh et al. | 372/45 |
| 6,067,310 A | * 5/2000 | Hashimoto | 372/49 |

FOREIGN PATENT DOCUMENTS

| | | |
|---|---|---|
| EP | 0 421 205 A2 | 4/1991 |
| EP | 0 447 327 | 9/1991 |
| EP | 0 603 780 A2 | 6/1994 |
| JP | 06-140710 | 5/1994 |
| JP | 09-116234 | 5/1997 |
| JP | 10-290046 | 10/1998 |

OTHER PUBLICATIONS

European Search Report dated May 27, 2002 in corresponding European Patent Application No. 00305647.2.

Chen et al., "Suppression of Defect Propagation in Semiconductors by Pseudomorphic Layers", Journal of Applied Physics, Institute of Physics, New York, U.S., vol. 74, No. 6, Sep. 15, 1993, pp. 3800–3804.

* cited by examiner

*Primary Examiner*—Quyen Leung
(74) *Attorney, Agent, or Firm*—Renner, Otto, Boisselle & Sklar, LLP

(57) ABSTRACT

A semiconductor device has a blocking layer disposed between the substrate and the active layer. The blocking layer inhibits the propagation of anti-phase domain defects (APDs) into the active layer. This decreases the density of defects in the active layer, and improves the performance characteristics of the laser device.

The blocking layer is disposed either wholly within one of the layers of the laser device, or at the interface between two layers of the laser device. The bandgap of the blocking layer is preferably substantially equal to the bandgap of the layer in which it is disposed, or to the bandgap of a layer to which it is adjacent. This prevents the formation of a potential, barrier, or a potential well in the laser structure, so that provision of the blocking layer does not affect the transport of carriers through the device.

In one embodiment the device is a laser device and is fabricated in the (Al,Ga,In)P system.

22 Claims, 10 Drawing Sheets

Schematic diagram of laser structure including a blocking layer to terminate APD's propagating through the laser structure.

Schematic diagram of a GaInP tensile strained layer located in the n-type cladding region

FIG.2 Schematic diagram of APD's running through a laser structure

FIG 3

FIG. 4  Schematic diagram of laser structure including a blocking layer to terminate APD's propagating through the laser structure.

FIG.5

Schematic diagram of a GaInP tensile strained layer located in the n-type cladding region

SEMICONDUCTOR DEVICE

BACKGROUND OF THE INVENTION

1. Field of the Invention

This invention relates to a semiconductor device and particularly, but not exclusively, to a semiconductor laser device that emits visible radiation in the wave-length range 630 nm to 680 nm. The laser device may be of the edge-emitting or of the surface-emitting type.

2. Description of the Related Art

Laser devices or laser diodes (LDs) fabricated in the (Al,Ga,In)P material system which emit visible light in the 630 nm–680 nm wavelength range are becoming increasingly important components of professional and consumer products. For example, it is envisaged that the Digital Video Disc (DVD) system will employ a 635 nm–650 nm wavelength LD capable of delivering up to 30 mW output power up to a temperature of 60° C. The next generation of semiconductor lasers will need an even greater maximum power output up to a higher (eg. 70° C.) operating temperature.

By the (Al,Ga,In)P system is meant the family of compounds having the general formula $(Al_xGa_{1-x})_{1-y}In_yP$, where both x and y are between 0 and 1. One particular advantage of this semiconductor system is that it is lattice-matched to a Gabs substrate when the indium mole fraction, y, is equal to 0.48.

A principal limitation of current (Al,Ga,In)P laser diodes is that they are incapable of operating for long periods (or with a sufficiently low threshold current) at the highest specified operating temperature. It is generally believed that this is caused by electron leakage from the active region of the device into the surrounding optical guiding region and subsequently into the p-type cladding region.

The generic structure of a separate confinement laser structure intended to generate light at 630–680 nm will now be described with reference to FIGS. 1(a) and 1(b).

Figure 1A:
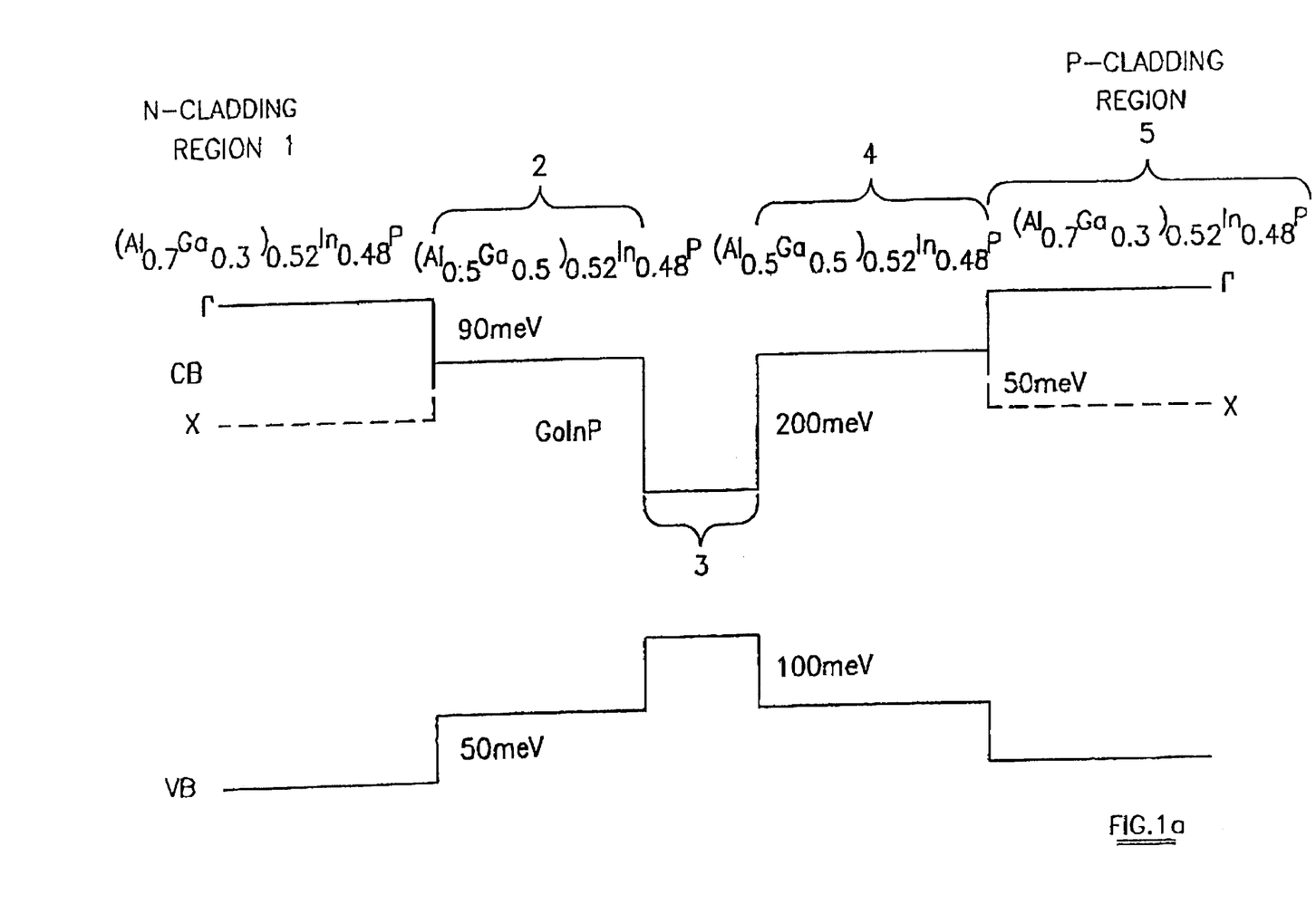
FIG. 1(a) is a schematic band structure of a conventional laser device fabricated in the (Al,Ga,In)P system.

FIG. 1(a) is a schematic band structure of a separate confinement laser structure fabricated in the (Al,Ga, In)P system. It consists of an n-doped $(Al_{0.7}Ga_{0.3})_{0.52}In_{0.48}P$ cladding region 1, an $(Al_{0.5}Ga_{0.5})_{0.52}In_{0.48}P$ optical guiding region 2, 4, a GaInP quantum well active region 3 disposed within the $(Al_{0.5}Ga_{0.5})_{0.52}In_{0.48}P$ optical guiding region, and a p-doped $(Al_{0.7}Ga_{0.3})_{0.52}In_{0.48}P$ cladding regions. A p-type contact layer (not shown in FIG. 1(a)) may be provided on the p-type cladding region 5, and an n-type contact layer (also not shown in FIG. 1(a)) may be provided on the n-type cladding region 1. Optical transitions giving rise to laser action in the quantum well active region 3 of the laser diode originate from electrons in the Γ-band in the GaInP quantum well active region.

The terms Γ-band and X-band as used herein refer to symmetry points it the Brillouin zone and are standard terms in solid state physics, see for example R. A. Smith "Semiconductors", (Cambridge University Press, 1978). The terms Γ-minimum and X-minimum refer to the minimum energy level of the Γ-band and the X-band, respectively.

The minimum energy in the conduction band of (Al,Ga, In)P is a function of the aluminium content. There is a crossover from a Γ-band minimum to an X-band minimum at an aluminium concentration of about 0.55.

Figure 1B:
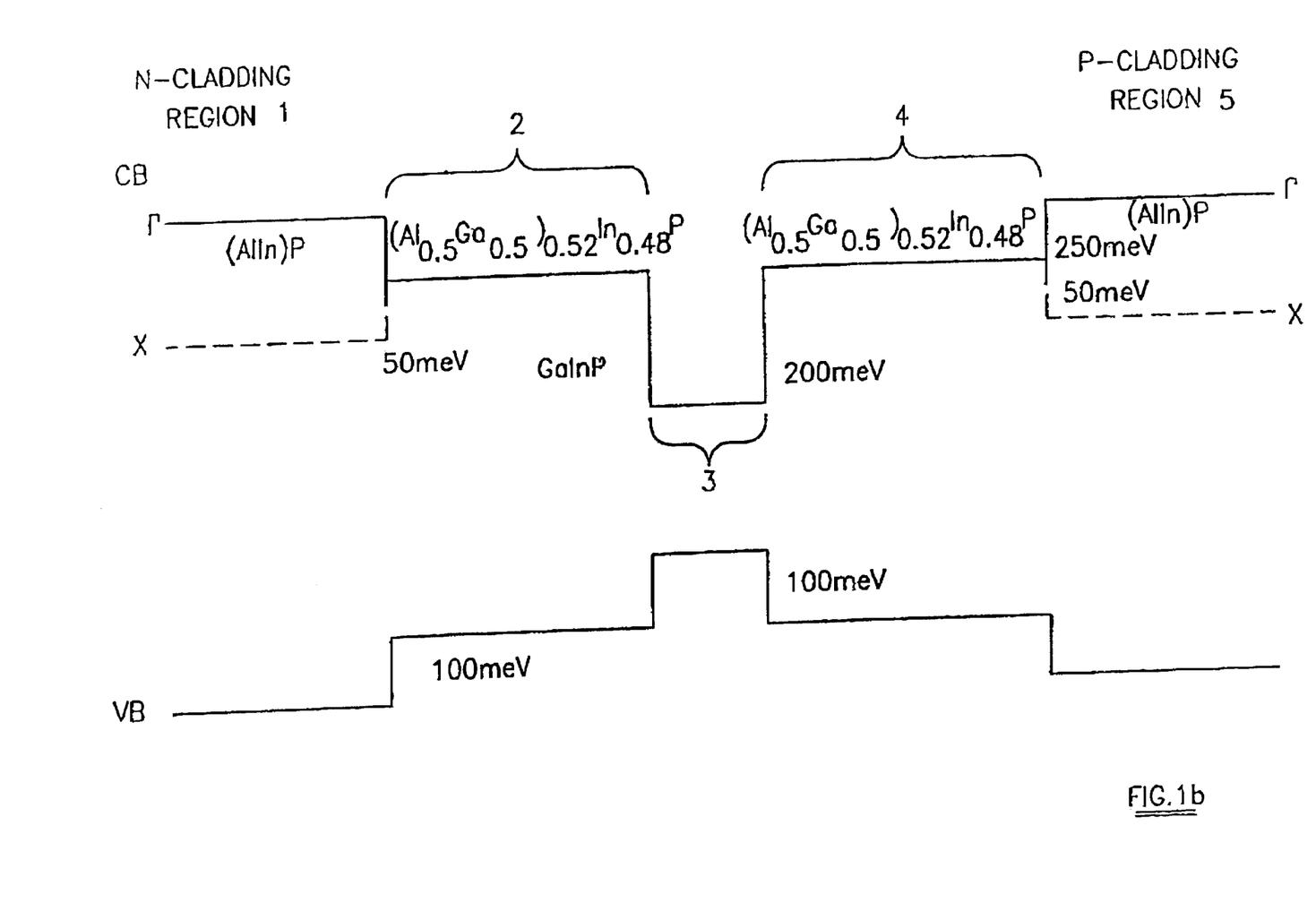
FIG. 1(b) is a schematic band structure of another conventional SCH laser device fabricated in the (Al,Ga,In)P system.

FIG. 1(b) illustrates a similar laser structure to that of FIG. 1(a), but the cladding regions 1,5 are formed of AlInP rather than $(Al_{0.7}Ga_{0.3})_{0.52}In_{0.48}P$ in order to increase the potential barrier confining Γ-electrons in the optical guiding region 2,4.

In FIGS. 1(a) and 1(b) the active region 3 is shown as containing a single quantum well layer. As is well known, however, the active region 3 may alternatively consist of a plurality of quantum well layers, with each quantum well layer being separated from an adjacent quantum well layer by a barrier layer.

Degradation of semiconductor lasers has been a major problem in developing commercial devices. AlGaAs/GaAs lasers having a lasing wavelength of around 0.85 μm were initially developed in the 1970s, but early examples of these lasers degraded quickly during use and, as a result, had a low lifetime and were unsuitable for commercial applications. It took a considerable time to overcome the significant degradation problems involved with these lasers. One of the main factors in the degradation of AlGaAs/GaAs lasers was crystal defects introduced during the crystal growth and fabrication processes These defects are known as "dark lines" defects, and give rise to a localised region of high non-radiative recombination centres which have high optical absorption. The problem of these dark line defects was eventually overcome by improving the structural quality of the GaAs, and long lifetime AlGaAs,GaAs lasers are now commercially available. M. Fukuda reports, in "Reliability and Degradation of Semiconductor Lasers and LEDs" ISBN 0-89006-465-2, that AlGaAs/GaAs lasers having a life time greater than 10,000 hours are now commercially available.

In order for (Al,Ga,In)P lasers to be commercially successful, these lasers must have a life time comparable with that of AlGaAs/GaAs lasers.

At present, wide bandgap phosphide lasers operating in the visible spectrum at a wavelength of about 650 nm display a severe degradation problem. Although the lifetime of low power phosphide lasers is approximately 10,000 hours which is satisfactory for commercial purposes, a typical lifetime of a high-power phosphide laser is only about 5,000 hours which is not commercially acceptable. Furthermore, it is necessary to anneal the lasers in order to obtain these lifetimes, and lasers that are not annealed have much shorter lifetimes.

The degradation problem is particularly serious for lasers fabricated using molecular beam epitaxy (MBE). At present, phosphide laser structures that are grown by MBE have to be thermally annealed in order to improve their reliability and to decrease the threshold for laser operation. It is presumed that the annealing process removes (or at least moves) some of the non-radiative recombination centres in the material. It is, however, undesirable to carry out an annealing step. One common p-type dopant for the p-type cladding region is beryllium, and if a beryllium-doped laser device is annealed beryllium can diffuse from the p-type cladding region into the active region. Such diffusion will degrade the performance of the laser device, and may also lower the yield of the manufacturing process.

M. Jalonen et al., report, in "Applied Physics Letters" Vol. 71 No. 4 p.479 (1997), laser oscillation thresholds for lasers grown by the MOCVD process in the range 0.2–0.4 kA/cm² compared to thresholds for material grown by MBE of >1 kA/cm², for an emission wavelength of 680 nm. It is possible that the poor degradation characteristics and higher laser thresholds for lasers grown by MBE arise because these materials have significantly more non-radiative recombination centres (or defects) than material grown by MOCVD. It 1s desirable to remove non-radiative defects in order to improve the reliability of phosphide lasers, and to lower their lasing threshold.

One particular type of defect that could well be responsible for the severe degradation and high laser thresholds in wide bandgap phosphide lasers is the anti-phase domain defect (APD). These defects arise in phosphide materials as a consequence of ordering occuring in the crystal structure. APDs give rise to a region of high non-radiative recombination, and of high optical absorption. Thus, the higher is the density of APDs, the higher will be the optical absorption and the higher will be the threshold for laser oscillation. A high density of domain boundaries also results in fluctuations in the refractive index of the material, and these fluctuations will cause additional photon loss and will hence decrease the quantum efficiency of the laser. The presence of APDs may also lower the yield of the manufacturing process.

C. Geng et al report, in "Journal of Crystal Growth" Vol. 170, page 418 (1997), that the domain structure can be responsible for the worsened laser performance of an ordered structure.

A. Valster et al. report, in "Journal of Crystal Growth" Vol. 107, page 403, (1991), that ordering must be avoided in order to produce a laser having a low threshold for laser oscillation.

T-Y Seong et al. report, in "Applied Physics Letters", Vol. 70, No. 23, page 3137 (1997), that APDs decrease the carrier mobility, Introduce deep energy levels, and decrease carrier life times.

Figure 2:
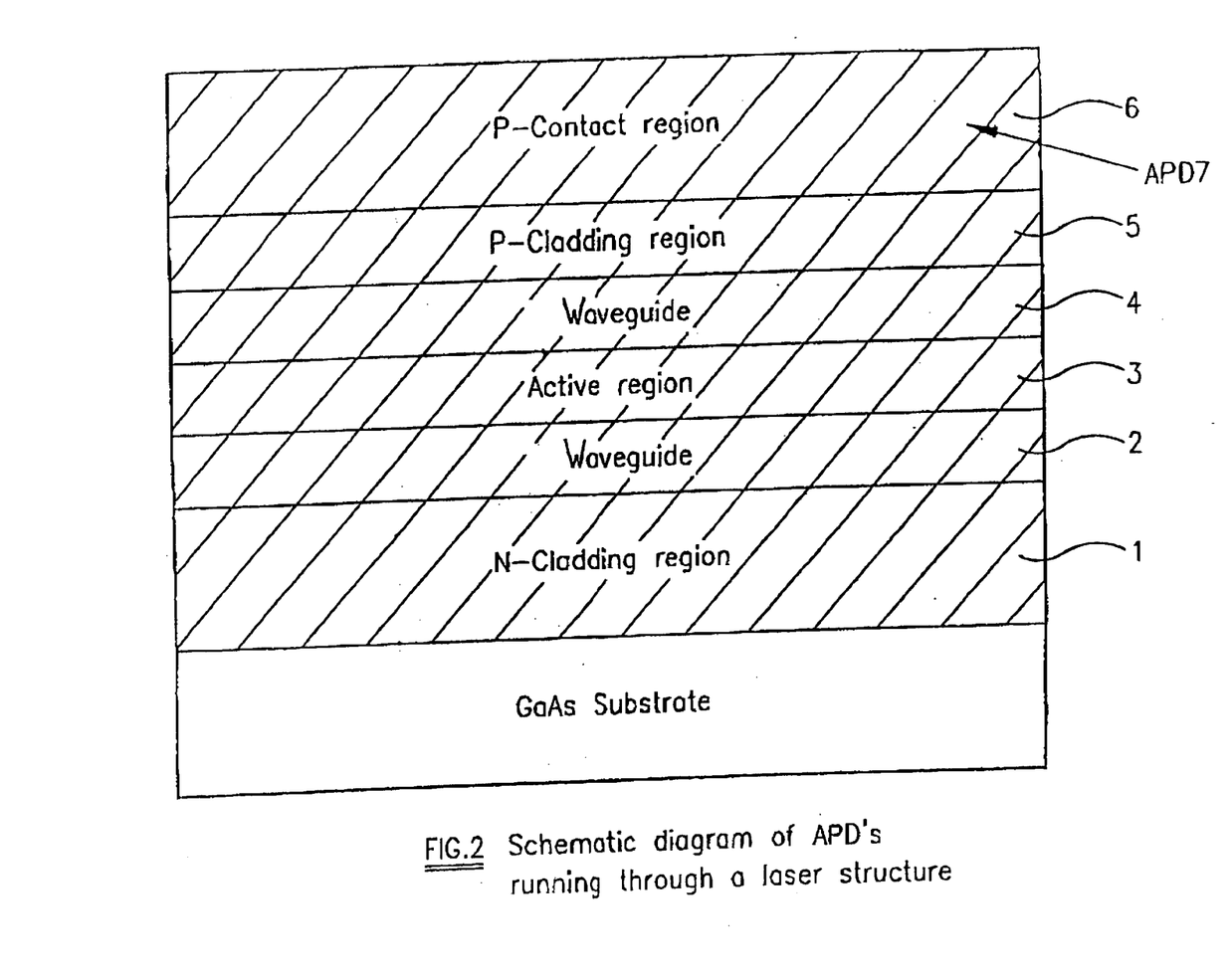
FIG. 2 is a schematic diagram showing APDs propagating through a conventional laser structure.

APDs start to form after about 1 $\mu$m of epitaxial growth, although this depends on the growth parameters such as the growth temperature and the V/III ratio during the growth process. In an (Al,Ga,In)P laser having the general structure shown in FIGS. 1(a) or 1(b), APDs usually form in the n-type contact layer (if one is provided) or in the n-type cladding layer 1, and extend right across the semiconductor laser through the active region to the p-type contact layer 6 disposed on the p-type cladding layer 5. FIG. 2 is a schematic sectional view of an SCH laser, such as the laser of FIG. 1(a) or FIG. 1(b) fabricated in the (Al,Ga,In)P system. APDs 7 run through the laser structure, from the n-type cladding region 1 to the p-type contact region 6.

TEM photographs of APDs running through laser structures are shown by C. Geng et al (above).

EP-A-0 603 780, EP-A-0 421 205, U.S. Pat. No. 5,508,554 and U.S. Pat. No. 4,835,166 relate to the growth of a semiconductor layer structure on a substrate that is not lattice-matched to the layer structure. The lattice mis-match between the substrate and the layer structure lead to the formation of defects and dislocations, and these documents propose growing a buffer layer at the interface between the substrate and the layer structure to reduce the effects of the lattice mis-match. These documents do not, however, address the problem of the formation and propagation of defects within the layer structure itself.

A. Valster et al (supra) report that the size of domains caused by ordering can vary by as much as a factor of 50, depending on the growth temperature and the aluminium mole fraction of the layer. They report domain sizes of up to 100 s of nm in material grown by MOCVD. T-Y Seong et al (supra) report a smaller domain size for material grown by gas source MBE, of typically 1.5 nm. A large number of domain boundaries will cause additional optical loss, and thus decrease the quantum efficiency of the laser device.

M. Jalonen et al (supra) propose that the threshold for laser oscillation of structures grown by MBE can be reduced significantly by annealing the laser structure, in order to remove non-radiative recombination defects. This is not, however, entirely satisfactory since, as noted above, annealing a device that contains beryllium as a dopant can cause diffusion of the beryllium.

It has been found by C. Geng et al (above) that a high concentration of zinc as a p-type dopant will suppress ordering in the p-type cladding region, but not in the active region.

TEM (Transmission Electron-Micrograph) studies of GaInP layers have shown that a large change in the V/III ratio can also suppress the propagation of APDs in GaInP. This is because the domain size depends, among other factors, on the V/III ratio. Thus, changing the V/III ratio during the growth process will change the domain size and will suppress the propagation of APDs. A large change in the temperature during the growth process will also cause a change in the domain size and thus suppress propagation of APDs. The disadvantage of changing the V/III ratio or the temperature during the growth process in order to suppress propagation of APDs is that an ordered/disordered interface is set up. This gives rise to a difference in bandgap, and so increases the resistivity of the layer.

P. L. Gourley et al report, in "Applied Physics Letters" Vol. 47 No. 5 page 482 (1985), reported the elimination of dark line defects in the AlGaAs/GaAs material system by using strained layer superlattices, such as GaP/GaAsP or GaAs/GaAsP superlattices. Furthermore, U.S. Pat. No. 5,300,794 discloses growing a strained superlattice on the buffer layer in order to suppress upwardly propagating dislocation defects in,a GaAs/GaAlAs laser structure. The disadvantage of these approaches is that using such superlattices will create a quantum well and/or barrier at each interface, and this will give rise to a high resistivity region. The GaAs/GaAlAs superlattice proposed in U.S. Pat. No. 5,300,794 will impede carrier injection into the active region of the laser device, thus increasing the resistance of the device.

SUMMARY OF THE INVENTION

The present invention provides a semiconductor device comprising: a substrate; and a multilayer structure disposed on the substrate, the multilayer structure comprising a first semiconductor layer and a second semiconductor layer disposed on the first semiconductor layer; characterised in that the device further comprises a layer for inhibiting the propagation of defects from the first semiconductor layer into the second semiconductor layer.

If defects such as APDs propagate in the first semiconductor layer, their propagation will be inhibited at the layer for inhibiting the propagation of defects, A reduced number of APDs or other defects will reach the second semiconductor layer, and this will reduce the density of absorption defects in the second semiconductor layer, thus improving the characteristics of the layer.

The second semiconductor layer may be an active layer of the device. The first semiconductor layer may be a cladding layer of the device. The device may be a separate confinement heterostructure laser device having an optical guiding region disposed on the cladding layer, the active layer being disposed in said optical guiding region. The present invention can be applied to a laser device, for example an SCH laser device, to improve the optical characteristics of the active layer of the laser device by inhibiting the propagation of defects such as APDs into the active layer.

The device may comprise the cladding layer, the optical guiding region and the active layer in this order. The layer for inhibiting the propagation of defects may be disposed within the cladding layer. Alternatively, the layer for inhibiting the propagation of defects may be disposed at the interface between the cladding layer and the optical guiding region, or it may be disposed within the optical guiding region.

The device may be an (Al,Ga,In)P device, and the layer for inhibiting the propagation of defects may be a $Ga_{1-y}In_yP$ layer. This allows the characteristics of device fabricated in the (Al,Ga,In)P system, such as an (Al,Ga,In)P laser device, to be improved. There is no need to anneal the device, so that the problem of diffusion of dopants during the annealing is eliminated. The layer for inhibiting the propagation of defects may be a strained $Ga_{1-y}In_yP$ layer.

The layer for inhibiting the propagation of defects may be disposed within 1 μm of the active layer. The typical domain size for APDs in a phosphide material is around 1 μm, so placing the layer for inhibiting the propagation of defects within 1 μm of the active layer means that APDs cannot re-form in the layers between the active layer and the layer for inhibiting the propagation of defects.

The bandgap of the layer for inhibiting the propagation of defects may be substantially equal to the bandgap of a semiconductor layer adjacent to the layer for inhibiting the propagation of defects. This prevents the formation of a significant potential well or potential barrier, thus ensuring that the transport of carriers through the device is unaffected by the provision of the layer for inhibiting the propagation of defects.

The layer for inhibiting the propagation of defects may be disposed within the first semiconductor layer, and the bandgap of the layer for inhibiting the propagation of defects may be substantially equal to the bandgap of the first semiconductor layer. Alternatively, the layer for inhibiting the propagation of defects may be disposed within the optical guiding region, and the bandgap of the layer for inhibiting the propagation of defects may be substantially equal to the bandgap of the optical guiding region. Alternatively, the layer for inhibiting the propagation of defects may be disposed at the interface between the cladding layer and the optical guiding region, and the bandgap of the layer for inhibiting the propagation of defects may be substantially equal either to the bandgap of the optical guiding region or to the bandgap of the cladding layer.

The first semiconductor layer may be an $(Al_yGa_{1-y})_{0.52}In_{0.48}P$ layer (0.5<y<1). The first semiconductor layer may be an $(Al_{0.7}Ga_{0.3})_{0.52}In_{0.48}P$ layer and the layer for inhibiting the propagation of defects may be a $Ga_{0.3}In_{0.7}P$ layer. Alternatively, the first semiconductor layer may be an $Al_{0.52}In_{0.48}P$ layer and the layer for inhibiting the propagation of defects may be a GaP layer. The optical guiding region may comprise an $(Al_yGa_{1-y})_{0.52}In_{0.48}P$ layer (0.3<y<0.5). The optical guiding region may comprise an $(Al_{0.5}Ga_{0.5})_{0.52}In_{0.48}P$ layer and the layer for inhibiting the propagation of defects may be a $Ga_{0.38}In_{0.62}P$ layer. For each of these pairs of materials the bandgaps of the two materials are substantially equal to one another, so that provision of the layer for inhibiting the propagation of defects does not cause a significant potential barrier or potential well. The cladding layers and the optical guiding region of an (Al,Ga,In)P laser device are often formed of $(Al_{0.7}Ga_{0.3})_{0.52}In_{0.48}P$ and $(Al_{0.5}Ga_{0.5})_{0.52}In_{0.48}P$ respectively, so that the invention allows a layer for inhibiting the propagation of defects to be incorporated into an (Al,Ga,In)P laser device without affecting the transport of carriers through the laser device.

The device may further comprise a second layer for inhibiting the propagation of defects into the second semiconductor layer.

The or each layer for inhibiting the propagation of defects may be for inhibiting the propagation of anti-phase domain defects into the second semiconductor layer.

The characteristic size of an anti-phase domain defeat in the or each layer for inhibiting the propagation of defects may be different from the characteristic size of an anti-phase domain defect in the second semiconductor layer. This is a straightforward way of inhibiting the propagation of anti-phase domains.

BRIEF DESCRIPTION OF THE DRAWINGS

Preferred embodiments of the invention will now be described in detail by way of illustrative example, with reference to the accompanying Figures in which.

DESCRIPTION OF THE PREFERRED EMBODIMENTS

Figure 4:
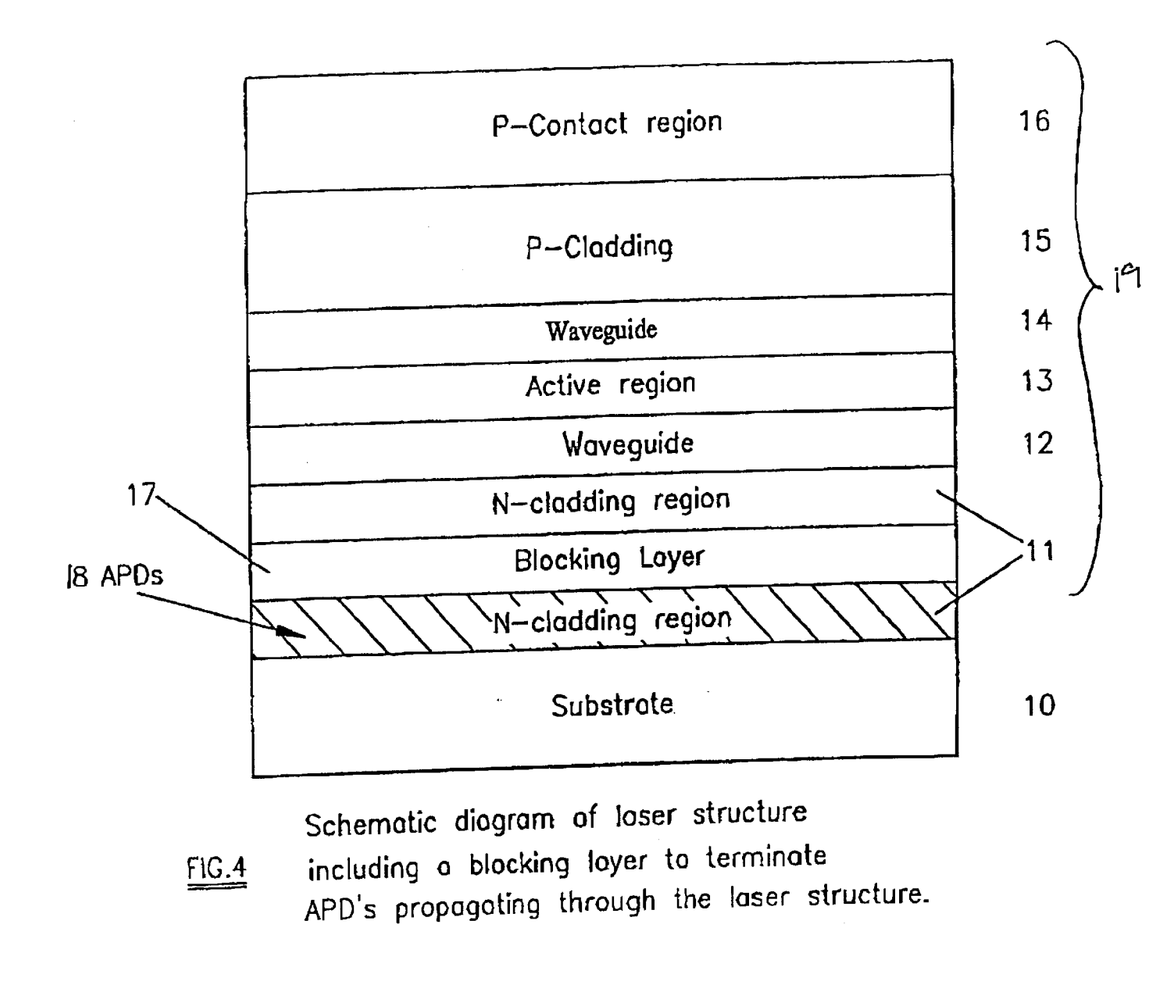
FIG. 4 is a schematic sectional view of a laser device according to one embodiment of the present invention.

FIG. 4 shows a laser device according to one embodiment of the invention. The laser device has a substrate 10, and a multilayer structure 19 disposed on the substrate 10. The multilayer structure 19 comprises an n-type cladding region 11, and an undoped optical guiding region 12, 14 disposed on the n-type cladding region 11. An active region 13 is disposed within the optical guiding region 12, 14. Finally, a p-type cladding region 15 and a p-type contact region 16 are disposed over the optical guiding region 14.

In FIG. 4 the active region 3 is shown as containing only a single quantum well layer. The invention is not limited to a laser in which the active region contains only one quantum well layer, however, and the invention can be applied to a laser in which the active region 3 consists of a plurality of quantum well layers and barrier layers.

According to the present invention, a blocking layer 17 is provided between the substrate 10 and the active region 13. The blocking layer serves to inhibit the propagation of APDs into the active region 13 of the laser device. In the embodiment of FIG. 4 the blocking layer 17 is disposed within the n-type cladding region 11, but the invention is not limited to this particular location for the blocking layer.

APDs 18 exist in the lower part of the n-type cladding region, but the propagation of APDs into the active layer 13 is inhibited by the blocking layer 17 because the characteristic size of APDs in the blocking layer 17 is significantly different to the characteristic size of APDs within the n-type cladding region 11.

Since the propagation of APDs 18 is inhibited by the blocking layer 17, no APDs (or at least a reduced number of APDs) reach the active region 13. Furthermore, in the embodiment of FIG. 4 no APDs, or a reduced number of APDs, reach the optical guiding region 12, 14. In consequence, the laser characteristics of the device are improved.

Figure 6:
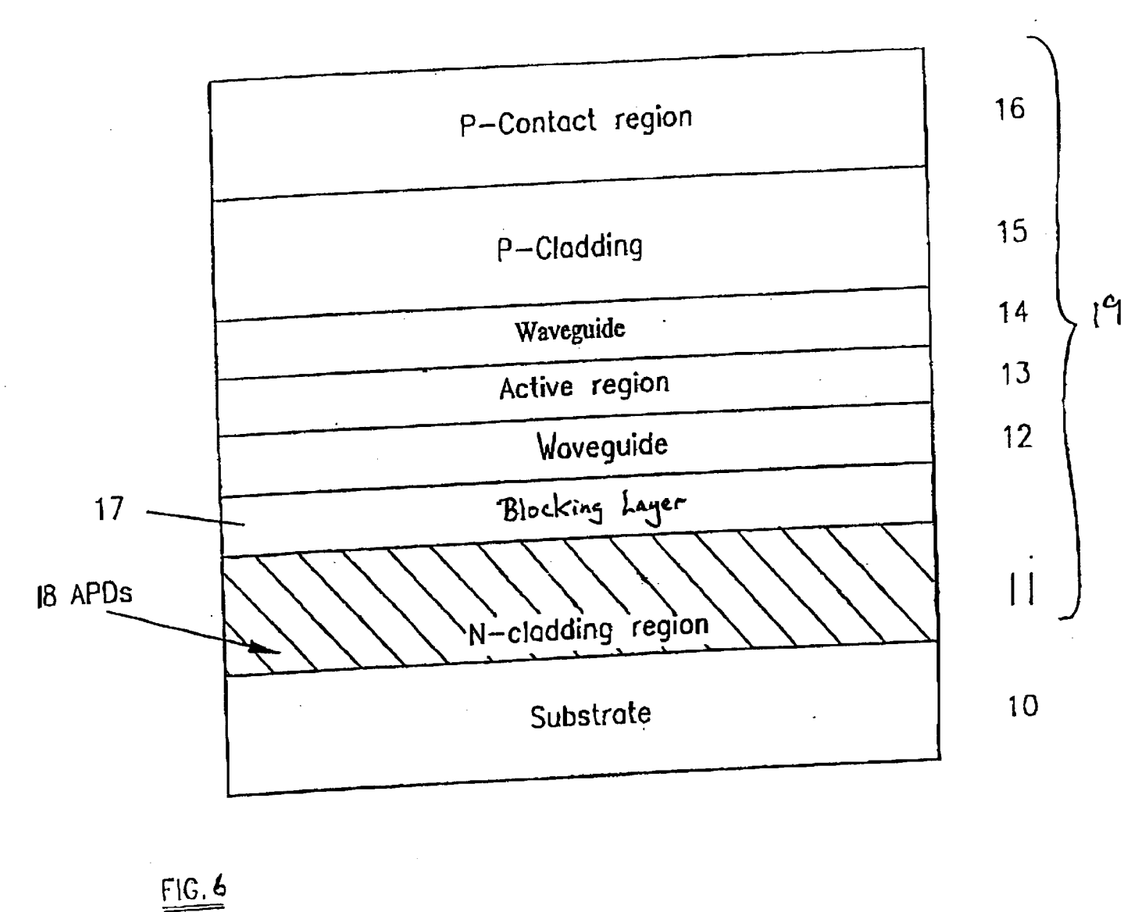
FIG. 6 is a schematic sectional view of a laser device according to another embodiment of the present is invention.
Figure 7:
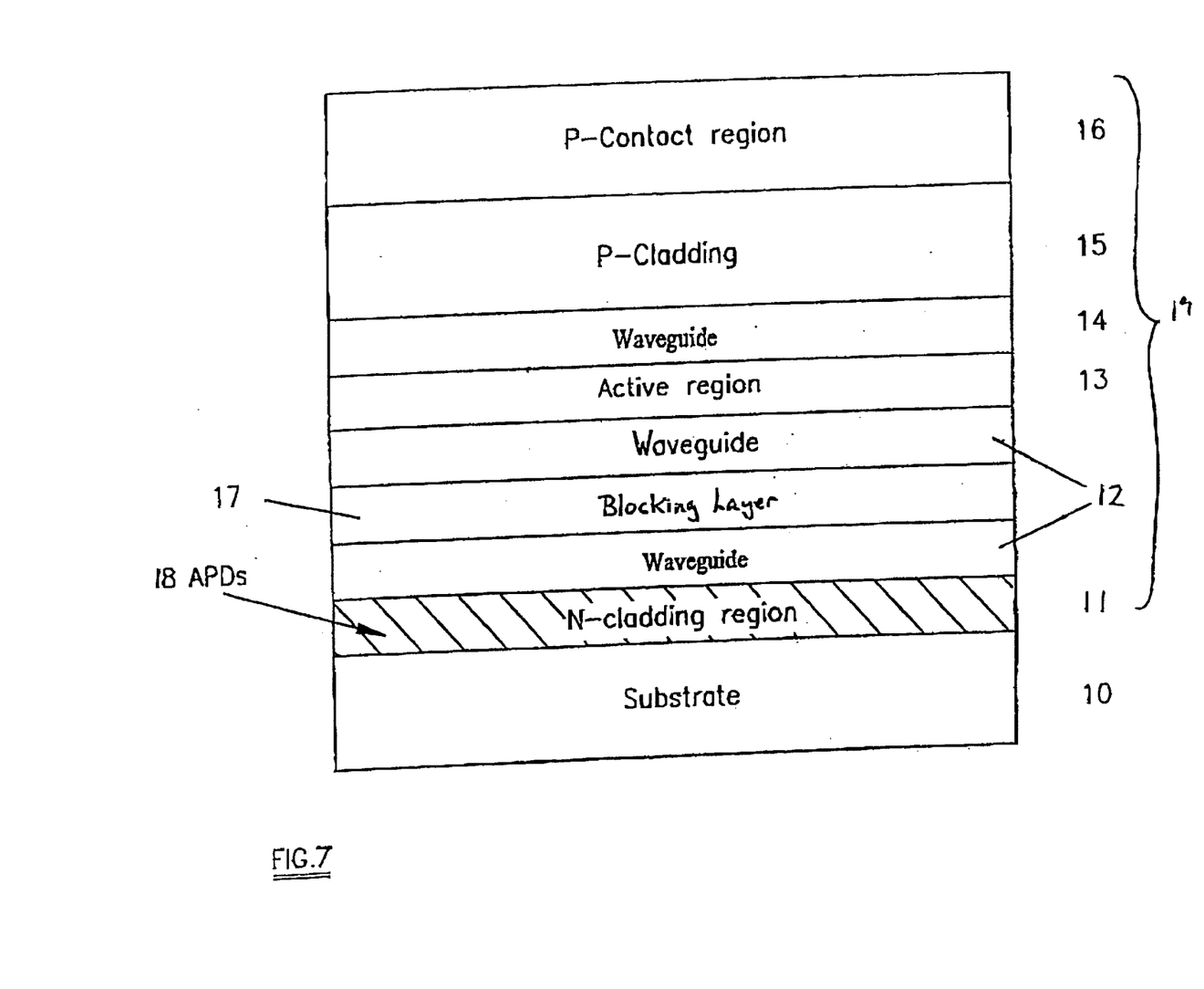
FIG. 7 is a schematic sectional view of a laser device according to another embodiment of the present invention.
Figure 8:
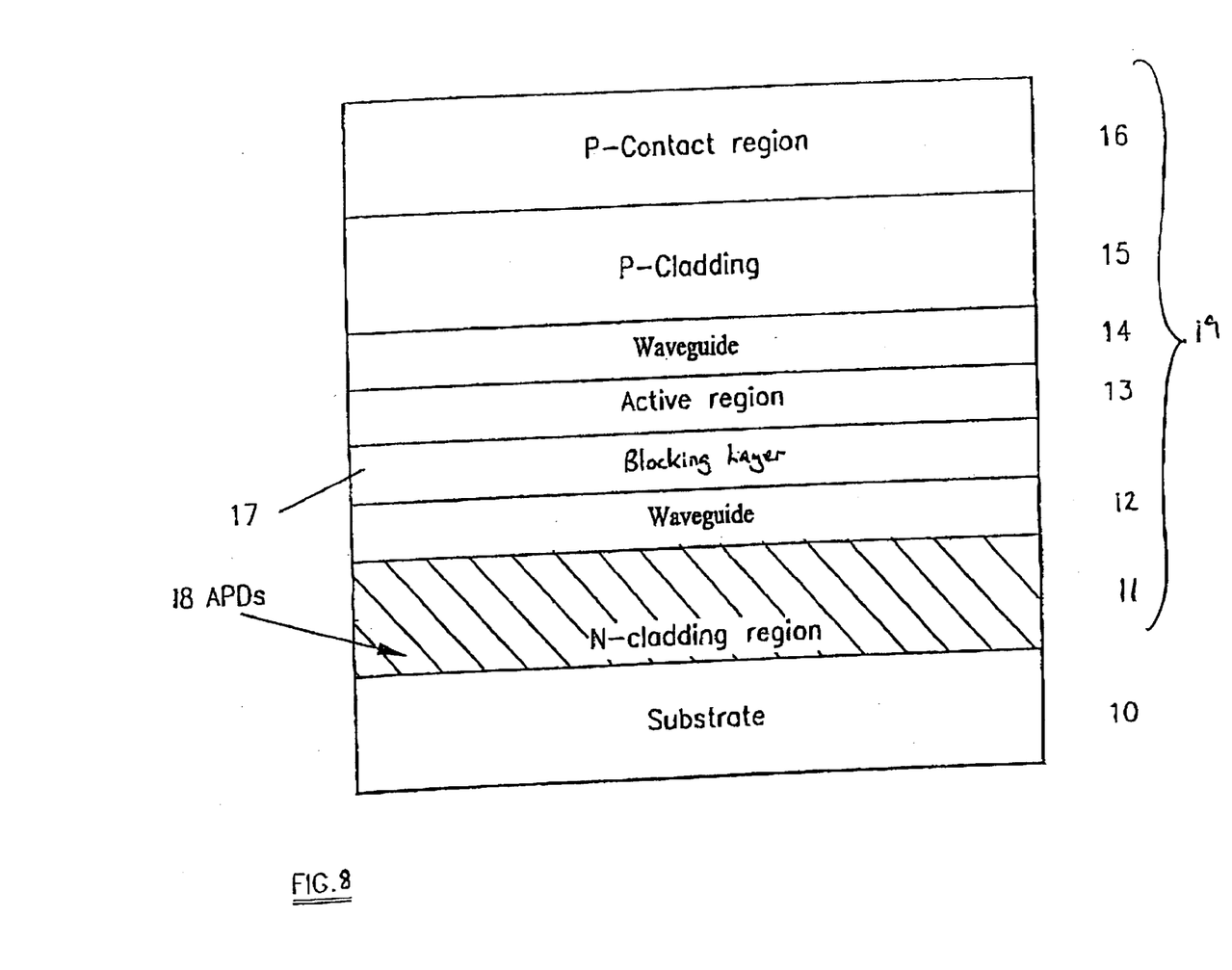
FIG. 8 is a schematic sectional view of a laser device according to another embodiment of the present invention.

The blocking layer 17 need not be located within the n-type cladding region 11, provided it is positioned so that it inhibits the propagation of APDs before they reach the active region 13. It could alternatively be located, for example, at the interface between the n-type cladding region 11 and the optical guiding region 12 as shown in FIG. 6. It could alternatively be located within the lower part of the optical guiding region 12 as shown in FIG. 7, or at the interface between the lower part of the optical guiding region 12 and the active region 13 as shown in FIG. 8. Apart from the location of the blocking layer 17, the laser structures shown in FIGS. 6,7 and 8 are generally similar to the laser structure shown in FIG. 4. In all the embodiments of FIGS. 4, 6, 7 and 8, the blocking layer is located between the active region and the substrate, so that it will inhibit the propagation of APDs before they reach the active region 13.

The blocking region 17 can in principle be disposed at any position below the active region 13. It is however preferable for the blocking layer to be located between the substrate and the optical guiding region 12, in order to inhibit the propagation of APDs into the optical guiding region. If APDs propagate into the optical guiding region 12, or into part of the optical guiding region 12, there will be a deterioration in the laser characteristics, even if the APDs are inhibited from propagating into the active region itself.

As noted above, the typical domain size for an APD in a phosphide material is around 1 $\mu$m. Where the present invention is applied to a phosphide laser, therefore, the blocking layer 17 is preferably disposed within 1 $\mu$m of the active region. This ensures that APDs cannot reform in the layers above the blocking layer.

Figure 9:
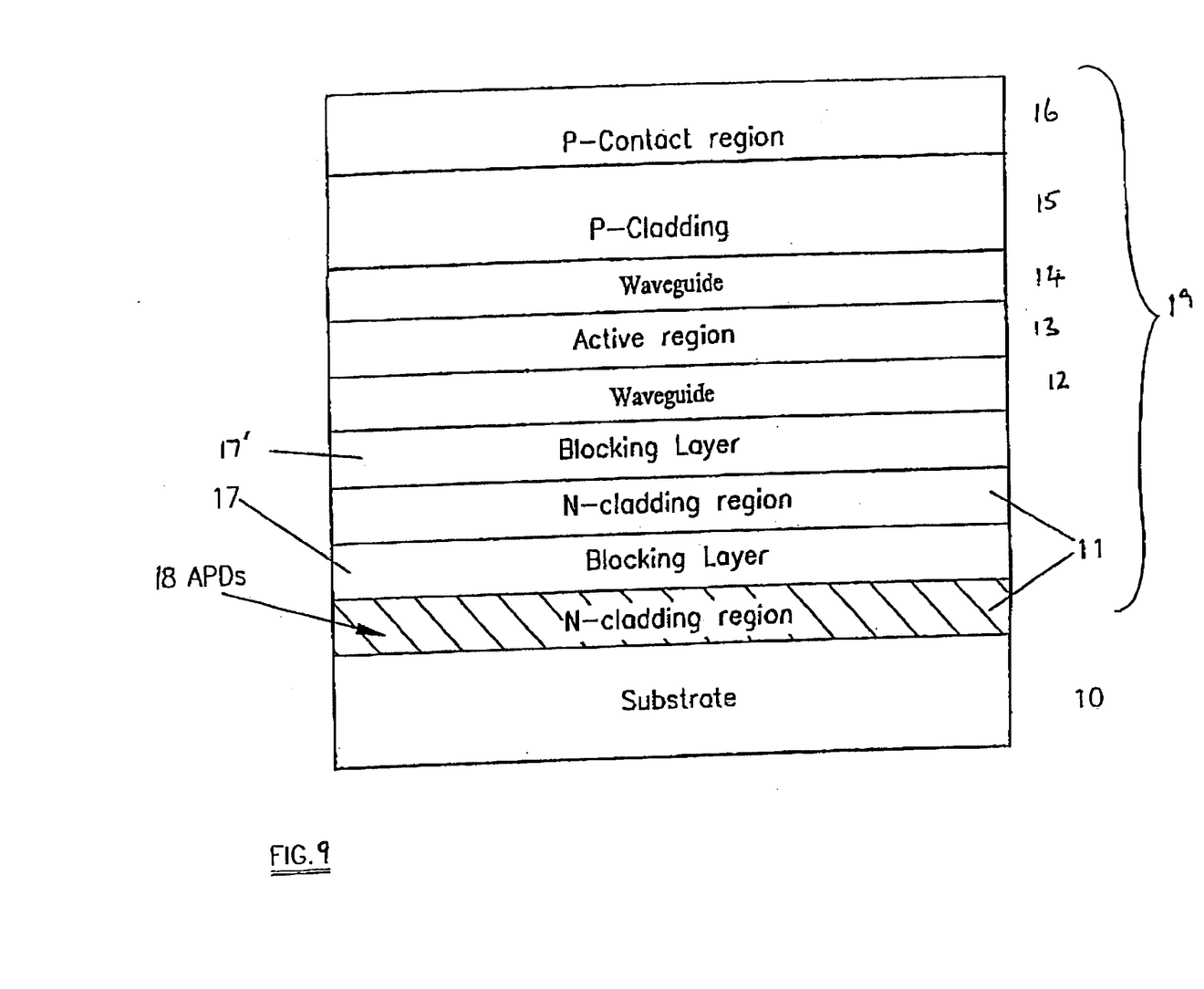
FIG. 9 is a schematic sectional view of a laser device according to another embodiment of the present invention.

The present invention is not limited to a single blocking layer, but it is possible to provide a laser structure with two or more blocking layers. FIG. 9 shows an embodiment of the invention in which a laser structure is provided with two blocking layers. In this embodiment, a first blocking layer 17 is provided within the n-type cladding region 11, and a second blocking layer 17' is provided at the interface between the n-type cladding region 11 and the optical guiding region 12, 14.

When the present invention is applied to an (Al,Ga,In)P laser, suitable materials for the blocking layer include GaP or $Ga_{1-y}In_yP$ (hereinafter GaInP).

Figure 3:
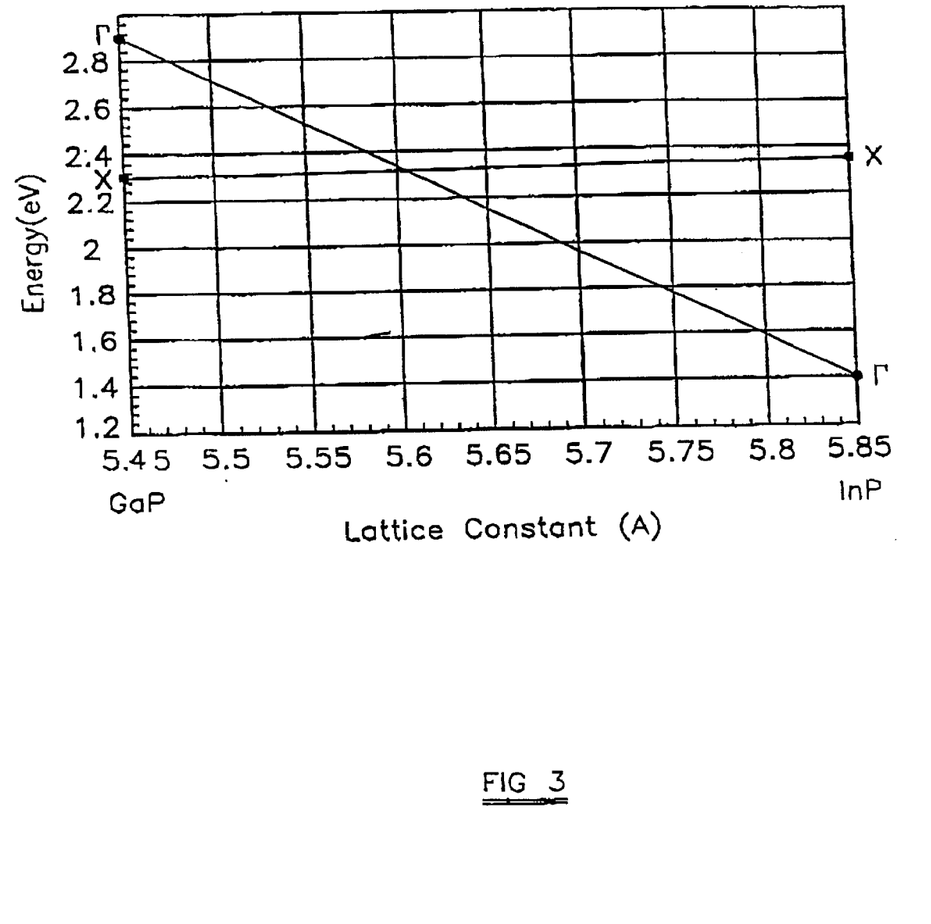
FIG. 3 shows the conduction band energy against lattice constant for GaInP.

As the indium mole fraction of GaInP is varied from 0 to 1 the lattice constant increases and the Γ—Γ bandgap decreases. The relationship between the bandgap and lattice constant is shown in FIG. 3, which also shows the Γ-X bandgap. FIG. 3 shows that GaP is an indirect semiconductor with Γ—Γ and Γ-X bandgaps of 2.9 eV and 2.3 eV respectively, and with a lattice constant of 5.451 Å. InP is a direct bandgap material with Γ—Γ and Γ-X bandgaps of 1.4 eV and 2.3 eV respectively. The lattice constant of GaAs is 5.653 Å and, as stated above, GaInP is lattice matched to GaAs when the indium mole fraction, y, is equal to 0.48.

Bulk GaAs has a lattice constant that is approximately 3.7% greater than that of bulk GaP. In general, dislocations would occur at an interface between two semiconductor materials having such a lattice mismatch. This is undesirable in the present case, since these dislocations would degrade the properties of the laser device.

It is well known that if the lattice mismatch between an underlying layer and a growing epilayer is sufficiently small, the first atomic layers which are deposited will be strained to match the lattice constant of the underlying layer so that a coherent interface will be formed. However, as the thickness of the growing epilayer increases, the homogeneous strain energy increases until a critical thickness is reached at which it becomes energetically favourable for misfit dislocations to be introduced. The existence of this critical thickness was first disclosed by J. H. Van Der Merwe in "Journal of Applied Physics" Vol. 34, page 123 (1962). In the present invention, if a laser structure is provided with a blocking layer made of a material whose bulk lattice constant Is not lattice matched to the semiconductor layers of the laser structure It is preferable that the thickness of the blocking layer is lower than the critical thickness, to prevent dislocations occuring. In this case, the blocking layer will be in a strained state and, as result of the strain, will be lattice matched to the semiconductor layers.

Where a GaP blocking layer is grown on a semiconductor layer that is lattice matched to GaAs, the blocking layer will be in a state of tensile Strain since it will have a lower lattice constant than the semiconductor layer.

For a lattice mismatch of 3.7%, the critical thickness at which misfit dislocations will occur is estimated to be 16 Å, see R. People et al, "Applied Physics Letters" Vol. 47 No. 3 pp. 322-324 1985. Where a strained GaP layer is used as the blocking layer, therefore, its thickness is preferably 16 Å or less.

When a thin GaP layer is placed under tensile strain, its bandgaps will not take the values given for bulk GaP in FIG. 3. Tensile strain will reduce the Γ—Γ bandgap by 0.144 eV to 2.756 eV, and the Γ-X bandgap will be increased slightly to 2.320 eV. These values of the Γ—Γ and Γ-X bandgaps for a tensile strained GaP layer are very similar to the bandgaps of AlInP. This means that it Is possible to use a blocking layer consisting of tensile strained GaP in a AlInP cladding layer without creating a significant potential barrier or potential well for carriers. Using the bandgaps given above, and assuming that there is a 70:30 band offset between the conduction and valence bands, suggests that there would be a small potential barrier of around 30 meV to Γ-electrons. This potential barrier is about the same as the value of kT at room temperature, where k is the Boltzmann constant and T is the absolute temperature, and this barrier will therefore not significantly affect the laser properties during operation at room temperature, In another embodiment of the invention, the blocking layer has a non-zero indium mole fraction. The bandgap of GaInP decreases as the indium mole fraction increases, and an advantage of using a tensile strained GaInP layer as the blocking layer is that the bandgaps of the blocking layer can be tuned to the bandgaps of the various quarternary alloys used in the laser structure, by appropriately adjusting the indium mole fraction of the blocking layer. For example, a tensile strained layer of $Ga_{0.3}In_{0.7}P$ has Γ—Γ and Γ-X bandgaps of 2.450 eV and 2.3 eV respectively, and these bandgaps are the same as those of $(Al_{0.7}Ga_{0.3})_{0.52}In_{0.48}P$ which is commonly used as a material for the cladding layers of a laser device. The critical thickness when a strained $Ga_{0.3}In_{0.7}P$ layer is grown on an $(Al_{0.7}Ga_{0.3})_{0.52}In_{0.48}P$ layer is 33 Å, so it is preferable for the thickness of the blocking layer to be less than this.

Another useful material for the blocking layer is a tensile strained layer of $Ga_{0.38}In_{0.62}$. The $\Gamma$–$\Gamma$ and $\Gamma$-X bandgaps of this material are 2.3 eV, which are the same as in $(Al_{0.5}Ga_{0.5})_{0.52}In_{0.48}P$, which is used to form the optical guiding layers of the laser devices shown in FIGS. 1(a) and 1(b). Since the bandgaps of $(Al_{0.5}Ga_{0.5})_{0.52}In_{0.48}P$ and $Ga_{0.38}In_{0.62}P$ are approximately equal, a $Ga_{0.38}In_{0.62}P$ blocking layer can be provided within an $(Al_{0.5}Ga_{0.5})_{0.52}In_{0.48}P$ optical guiding layer without introducing a significant potential well or potential barrier. The critical thickness for $Ga_{0.38}In_{0.62}P$ layer is around 60 Å.

Figure 5:
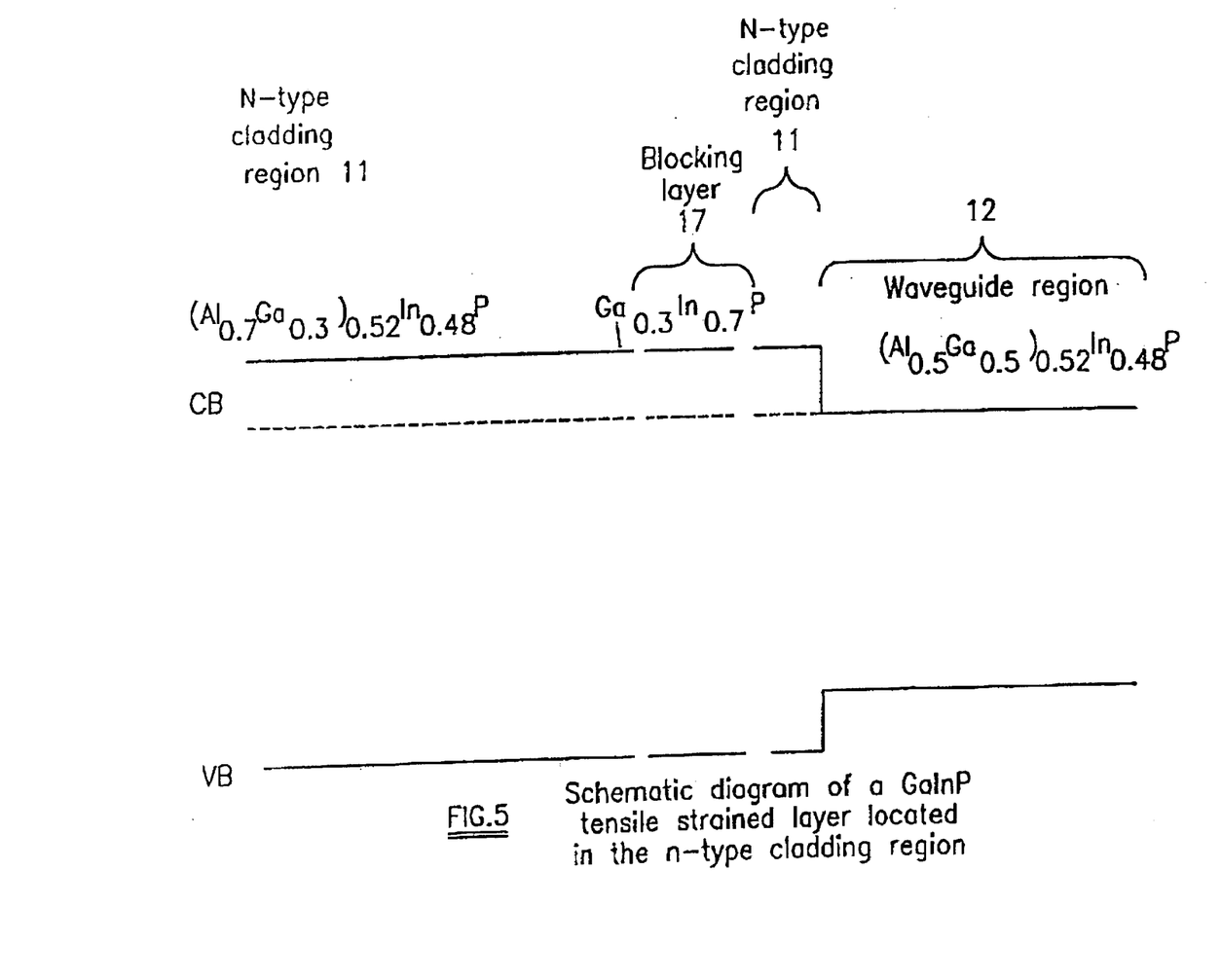
FIG. 5 is a schematic partial band structure diagram of the laser device of FIG. 4.

FIG. 5 is a partial schematic bandgap diagram of the laser device of FIG. 4. FIG. 5 shows the bandgaps for the n-cladding region 11, the blocking layer 17 and part of the optical guiding region 12. The n-type cladding region 11 is formed of $(Al_{0.7}Ga_{0.3})_{0.52}In_{0.48}P$, and the optical guiding region is formed of $(Al_{0.5}Ga_{0.5})_{0.52}In_{0.48}P$. The blocking layer 17 is disposed within the n-type cladding region 11, and is formed of a strained layer of $Ga_{0.3}In_{0.7}P$. As FIG. 5 shows, the $\Gamma$—$\Gamma$ and $\Gamma$-X bandgaps of the blocking layer 17 are similar to those of the cladding region in which the blocking layer is provided, so that no potential barriers or potential well is formed.

In the embodiment of FIG. 5, the thickness of the blocking layer 17 should be less than 33 Å, which is the critical thickness of a layer of $Ga_{0.3}In_{0.7}P$ layer mis-matched to GaAs.

If the blocking layer were provided in the optical guiding region 12 rather than in the n-type cladding region 11, It would be preferable for the blocking layer to be formed of $Ga_{0.38}In_{0.62}P$. This material is bandgap matched to an $(Al_{0.5}Ga_{0.5})_{0.5}In_{0.48}P$ optical guiding region.

Where a blocking layer is provided at an interface between two layers, for example between a cladding layer and an optical guiding region, the bandgaps of the blocking layer can be matched either of the layers.

Although the specific embodiments described above relate primarily to the (Al,Ga,In)P system, the present invention is not limited to this system. It can be applied to any materials system which shows an ordering effect such that the propagation of defects such as APDs through a semiconductor structure cause significant degradation of the device properties.

Although the blocking layer of FIG. 5 has bandgaps that are similar to the bandgaps of the layer in which the blocking layer is placed, this is not an essential feature of the invention. It is, however, a preferred feature, since any mis-match in the bandgap will cause either a potential barrier or a potential well, and this will disrupt transport of carriers into the active region of the device.

The present invention is of particular advantage when applied to semiconductor laser devices, since these are very sensitive to defects. The present invention is not, however, limited to laser devices but can be applied to other semiconductor devices such as, for example, light-emitting diodes.

What is claimed is:

1. An (Al,Ga,In)P semiconductor device comprising:
a substrate; and
a multilayer structure disposed on the substrate,
wherein the multilayer structure comprises a first semiconductor layer, a second semiconductor layer disposed on the first semiconductor layer, and at least a third semiconductor layer and a fourth semiconductor layer being disposed between the substrate and a contact region within the multilayer structure, the third and fourth layers being composed of optical guiding material,
characterized in that the device further comprises a $Ga_{1-y}In_yP$ layer for inhibiting the propagation of anti-phase domain defects from the first semiconductor layer into the second semiconductor layer, and
the bandgap of the layer for inhibiting the propagation of defects is substantially equal to the bandgap of a semiconductor layer adjacent to the layer for inhibiting the propagation of defects.

2. A device as claimed in claim 1 wherein the second semiconductor layer is an active layer of the device.

3. A device as claimed in claim 1 wherein the first semiconductor layer is a cladding layer of the device.

4. A device an claimed in claim 3 wherein the layer for inhibiting the propagation of defects is disposed within the cladding layer.

5. A device as claimed in claim 1 wherein the device is a separate confinement heterostructure laser device, the first semiconductor layer is a cladding layer, and the second semiconductor layer is an active layer disposed within the optical guiding region of the third and fourth layers.

6. A device as claimed in claim 5 wherein the bandgap of the layer for inhibiting the propagation of defects is substantially equal to the bandgap of a semiconductor layer adjacent to the layer for inhibiting the propagation of defects.

7. A device as claimed in claim 6, wherein the layer for inhibiting the propagation of defects is disposed between the third and fourth semiconductor layers, and the bandgap of the layer for inhibiting the propagation of defects is substantially equal to the bandgap of the third and fourth semiconductor layers.

8. A device as claimed in claim 7 wherein the third and fourth semiconductor layers comprise $(Al_yGa_{1-y})_{0.52}In_{0.48}P$ ($0.3<y<0.5$).

9. A device as claimed in claim 8 wherein the third and fourth semiconductor comprise $(Al_{0.5}Ga_{0.5})_{0.52}In_{0.48}P$, and the layer for inhibiting the propagation of defects is a $Ga_{0.38}In_{0.62}P$ layer.

10. A device as claimed in claim 6, wherein the layer for inhibiting the propagation of defects is disposed at the interface between the cladding layer and the third and fourth semiconductor layers, and the bandgap of the layer for inhibiting the propagation of defects is substantially equal either to the bandgap of the third and fourth semiconductor layers, or to the bandgap of the cladding layer.

11. A device as claimed in claim 1 wherein a region of the multilayer structure is such that the first semiconductor layer is a cladding layer, and the second semiconductor layer is an active layer disposed on the third semiconductor layer.

12. A device as claimed in claim 11 wherein the layer for inhibiting the propagation of defects is disposed within the first semiconductor layer, and the first semiconductor layer is a cladding layer.

13. A device as claimed in claim 11 wherein the layer for inhibiting the propagation of defects is disposed between the cladding layer and the third and fourth semiconductor layers.

14. A device as claimed in claim 11 wherein the layer for inhibiting the propagation of defects is provided between the third and fourth semiconductor layers.

15. A device as claimed in claim 1, wherein the layer for inhibiting the propogation of defects is a strained $Ga_{1-y}In_yP$ layer.

16. A device as claimed in claim 1, wherein the layer for inhibiting the propagation of defects is disposed within 1 μm of the second semiconductor layer, the second semiconductor layer being an active layer.

17. A device as claimed in claim 1, wherein the layer for inhibiting the propagation of defects is disposed within the first semiconductor layer, and the bandgap of the layer for inhibiting the propagation of defects is substantially equal to the bandgap of the first semiconductor layer.

18. A device as claimed in claim 17 wherein the first semiconductor layer is an $(Al_yGa_{1-y})_{0.52}In_{0.48}P$ layer $(0.5<y<1)$.

19. A device as claimed in claim 18 wherein the first semiconductor layer is an $(Al_{0.7}Ga_{0.3})_{0.52}In_{0.48}P$ layer and the layer for inhibiting the propagation of defects is a $Ga_{0.3}In_{0.7}P$ layer.

20. A device as claimed in claim 18 wherein the first semiconductor layer is an $Al_{0.52}In_{0.48}P$ layer and the layer for inhibiting the propagation of defects is a GaP layer.

21. A device as claimed in claim 1 and further comprising a second layer for inhibiting the propagation of defects into the second semiconductor layer.

22. A device as claimed in claim 1 wherein the characteristic size of the anti-phase domain defect in the layer for inhibiting the propagation of defects is different from the characteristic size of an anti-phase domain defect in the second semiconductor layer.

* * * * *